US005542002A

United States Patent [19]
Choate et al.

[11] Patent Number: 5,542,002
[45] Date of Patent: Jul. 30, 1996

[54] METHOD AND APPARATUS FOR AUTOMATICALLY INSPECTING A LITHOGRAPHIC PLATE AND READING ITS FOLIO

[75] Inventors: Daniel G. Choate, Everton; Kelly T. McMasters; John W. Powers, both of Springfield, all of Mo.

[73] Assignee: Western Litho Plate & Supply Co., St. Louis, Mo.

[21] Appl. No.: 196,955

[22] Filed: Feb. 15, 1994

Related U.S. Application Data

[63] Continuation-in-part of Ser. No. 76,411, Jun. 11, 1993, Pat. No. 5,454,247.

[51] Int. Cl.$^6$ ............................................. G06K 9/00
[52] U.S. Cl. ........................ 382/112; 382/141; 382/287; 382/306
[58] Field of Search ........................... 382/1, 8, 10, 100, 382/112, 141, 181, 287, 305, 306; 348/88, 92, 94, 95; 101/453; 364/419.19

[56] References Cited

U.S. PATENT DOCUMENTS

| | | | |
|---|---|---|---|
| 4,573,190 | 2/1986 | Tsunoda et al. | 382/1 |
| 5,181,162 | 1/1993 | Smith et al. | 364/419.19 |
| 5,193,690 | 3/1993 | Powers et al. | 209/558 |
| 5,213,043 | 5/1993 | Reimers et al. | 101/453 |
| 5,454,247 | 10/1995 | Powers et al. | 72/37 |

*Primary Examiner*—Leo Boudreau
*Assistant Examiner*—Phuol Tran
*Attorney, Agent, or Firm*—Senniger, Powers, Leavitt & Roedel

[57] ABSTRACT

Lithographic plates have an identifying folio and an image thereon. The image corresponds to a print image to be printed on sheet material such as newspaper stock. An image camera optically examines the identifying folios of each of the lithographic plates to ascertain folio information, and optically examines the images of each of the lithographic plates to ascertain image information including registration information and exposure information. A CPU records in an the electronic memory the ascertained folio information of the identifying folio of each lithographic plate and records in the electronic memory the corresponding ascertained image information of the image of each lithographic plate. An operator using a keyboard can access the image information of a particular plate recorded in the electronic memory by reference to the corresponding recorded folio information for the particular plate whereby the folio information and the image information are cross-referenced. The image information may also be compared to predefined information and the difference is stored and cross-referenced to the folio information.

31 Claims, 3 Drawing Sheets

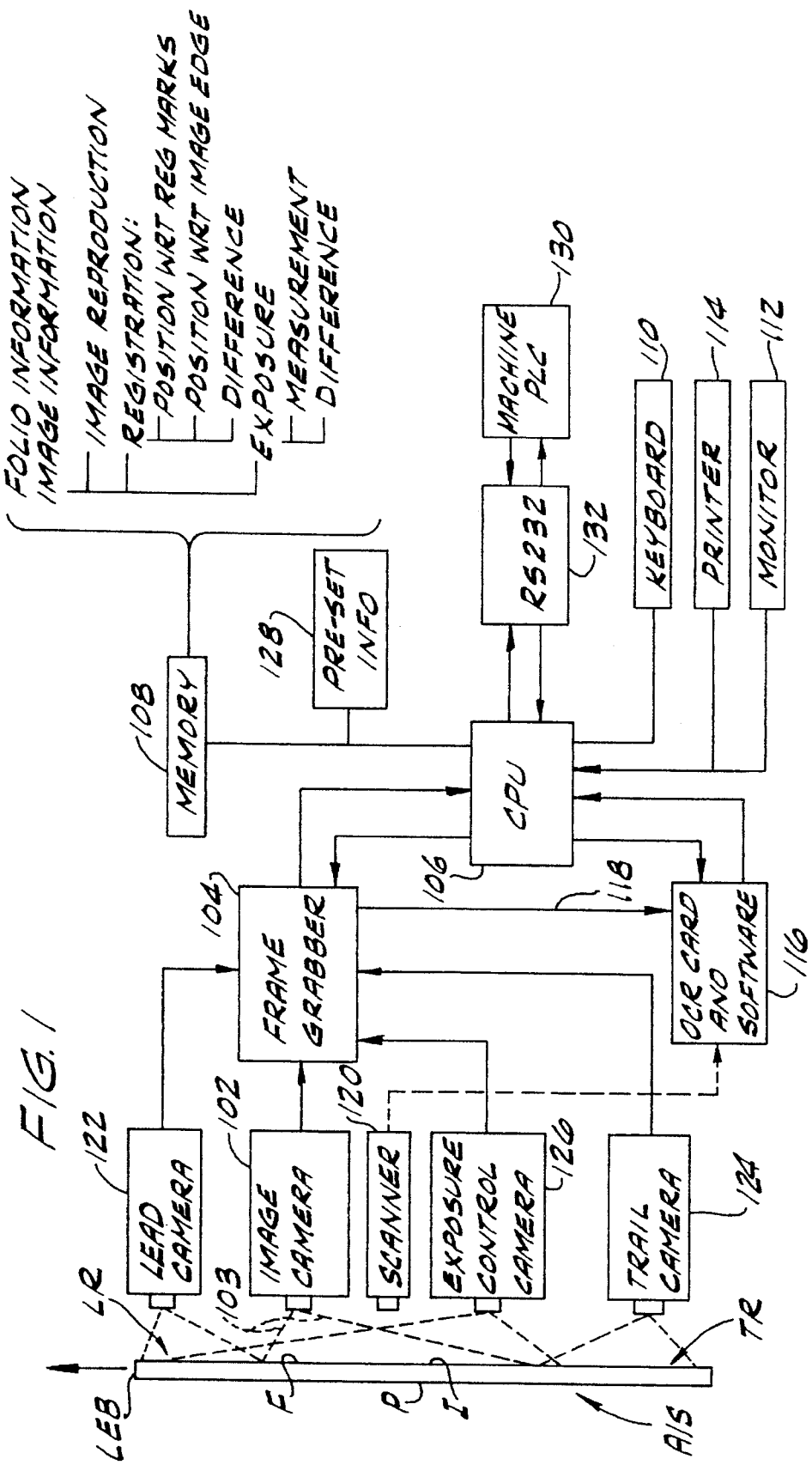

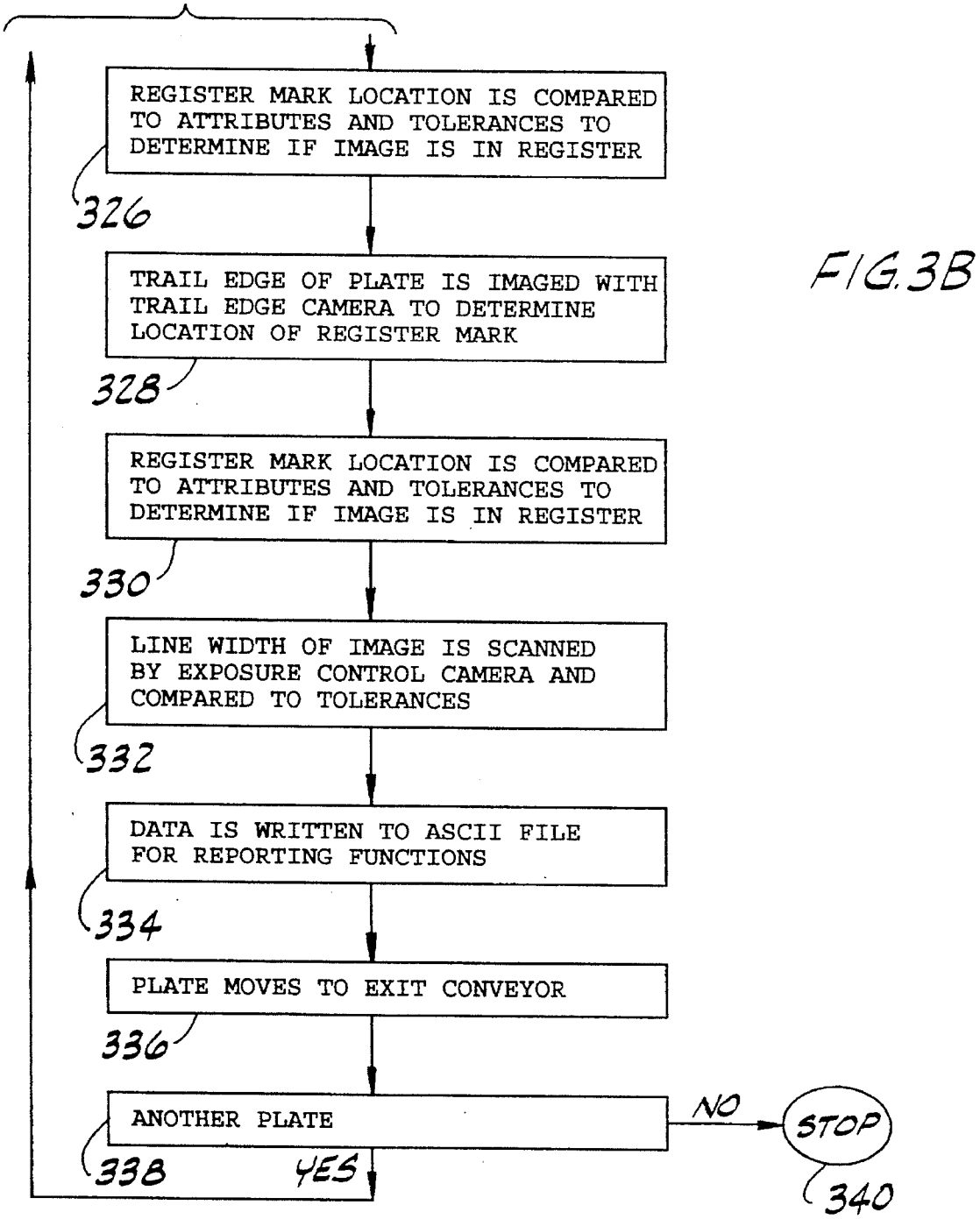

5,542,002

METHOD AND APPARATUS FOR AUTOMATICALLY INSPECTING A LITHOGRAPHIC PLATE AND READING ITS FOLIO

CROSS REFERENCE TO RELATE APPLICATIONS

This is a continuation-in-part of U.S. patent application Ser. No. 76,411, filed Jun. 11, 1993, now U.S. Pat. No. 5,454,247, assigned to Western Litho Plate and Supply Company of St. Louis, Mo.

BACKGROUND OF THE INVENTION

This invention generally relates to the processing of lithographic plates and, more particularly, to method and apparatus for automatically inspecting a lithographic plate after it has been exposed and bent to ascertain image information and folio information which are cross-referenced.

In printing a lithographic color image on newspaper stock, for example, stock is fed through successive rolls of a press. One or more lithographic plates are mounted on each roll for printing a single color of the image on the stock, with different color plates on successive rolls adding different colors to the image. To produce a clear final image, it is essential that precise registration of the images be achieved; otherwise the superimposed printed color images on the stock will be out of registration. Obtaining such registration is difficult. Not only must the image be precisely applied to the plate during the exposure process, but the exposed plate must be precisely bent to form the flanges required for mounting the plate on the press. Over the years plates have been checked for proper image registration in various ways, but these have proven to be less than entirely satisfactory, either because the inspection has occurred prior to the time the plate is in final form (e.g., prior to the bending step), thus making a final check of registration impossible, or because the inspection has involved manual steps, such as manually conveying a plate from the inspection station, all of which greatly increases the time and labor required before the plate is ready for application to a press.

Furthermore, once image information such as registration information has been gathered from a plate which has been inspected, there is a need for cross-referencing such image information with folio information. Such cross-referencing would allow the image information to be later accessed based on the folio information. Such cross-referencing permits later access to the information to identify or confirm the image information at a later time. In addition, such cross-referencing and later access of the information permits an overview of the information to identify pattern failures within a particular process.

SUMMARY OF THE INVENTION

Among the several objects of this invention may be noted the provision of an improved method and apparatus for automatically inspecting a lithographic plate to determine image information and folio information; the provision of such method and apparatus which cross-references the image information based on the folio information so that the image information may be accessed at a later time; the provision of such a method and apparatus which evaluates the image information within selected tolerances and cross-references the evaluation to the folio information; the provision of such method and apparatus which greatly reduces the time and labor involved in the automatic inspection and cross-referencing of image and folio information.

This invention comprises an apparatus for inspecting lithographic plates. Each plate has an identifying folio and an image thereon, the image corresponding to a print image to be printed on sheet material such as newspaper stock. Means optically examines the identifying folios of each of the lithographic plates to ascertain folio information, and optically examines the images of each of the lithographic plates to ascertain image information. Means, responsive to the optically examining means, records in an electronic memory the ascertained folio information of the identifying folio of each lithographic plate examined by the optically examining means and for records in the electronic memory the corresponding ascertained image information of the image of each lithographic plate examined by the optically examining means. Means accesses the image information of a particular plate recorded in the electronic memory by reference to the corresponding recorded folio information for the particular plate whereby the folio information and the image information are cross-referenced. The image information may include registration information indicating the position of the image relative to the plate or exposure information indicating the exposure of the image.

The invention also comprises a method for inspecting lithographic plates. Each plate has an identifying folio and an image thereon, the image corresponding to a print image to be printed on sheet material such as newspaper stock. The method comprising the steps of:

optically examining the identifying folios of each of the lithographic plates to ascertain folio information;

optically examining the images of each of the lithographic plates to ascertain image information;

recording in an electronic memory the ascertained folio information of the identifying folio of each lithographic plate optically examined;

recording in the electronic memory the corresponding ascertained image information of the image of each lithographic plate optically examined; and accessing the image information of a particular plate recorded in the electronic memory by reference to the corresponding recorded folio information for the particular plate whereby the folio information and the image information are cross-referenced.

Other objects and features will be in part apparent and in part pointed out hereinafter.

BRIEF DESCRIPTION OF THE DRAWING

FIG. 1 is a block diagram of one preferred embodiment of the system according to the invention.

FIG. 2 is a graphic illustration of a folio which is examined by a system according to the invention.

FIGS. 3A and 3B are a flow chart of one preferred embodiment of the method according to the invention.

Corresponding reference characters indicate corresponding parts throughout the drawings.

DETAILED DESCRIPTION OF THE PREFERRED EMBODIMENT

Figure 3A:
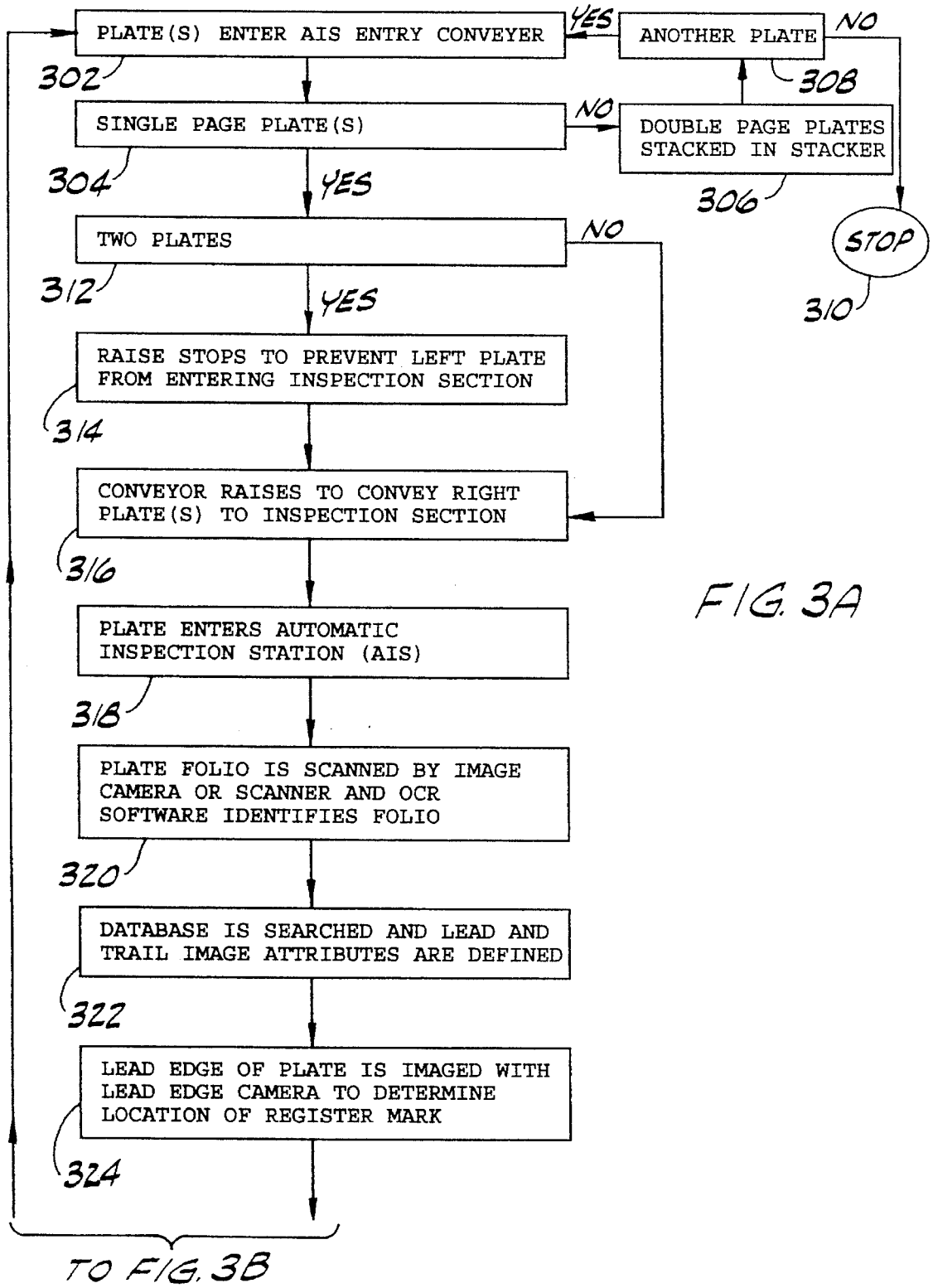

It is contemplated that this invention may be used in combination with a method and apparatus for automatically inspecting an exposed and bent lithographic plate such as described and claimed in co-assigned U.S. Pat. No. 5,193, 690, the entire disclosure of which is incorporated herein by reference.

Referring now to the drawings, FIG. 1 illustrates a block diagram of an apparatus for inspecting lithographic plates P according to the invention. Each plate has an identifying folio F thereon and an image I thereon. The image corresponds to a print image to be printed on a sheet material such as newspaper stock. An example of a folio F is illustrated in FIG. 2. In general, the folio F contains some or all of the information required to print the sheet material such as a newspaper or commercial document. The folio F can be on the printed or image area of the press plate P, such as illustrated in FIG. 1, where it will appear on the printed document. Alternatively, the folio F may be located in a non-image area of the plate such as on the bent flanges of a plate of the type described in U.S. Pat. No. 5,193,690.

A typically newspaper folio F is illustrated in FIG. 2 and would include information such as the title 200 of the newspaper (Springfield Times), the edition 202 of the newspaper (EVE meaning evening), the date 204 (Aug. 13, 1993), the section 208 of the newspaper (C1), the zone identification 206 of the location of the image (NE1) (NEI meaning Northwest Area No. 1), and the plate color 210 identifying the particular ink which will be used to print the image on the newspaper stock (CYAN). Title 200 and edition 202 information are usually included where more than one newspaper is printed in a day or where more than one edition is printed such as a morning edition and an evening edition. Section information 208 is required where a paper is divided into several sections, usually identified with a letter of the alphabet. Zone information 206 is required where a newspaper sends out different sections in a newspaper that corresponds to the area that the paper is being sent, such as a certain suburb or neighboring town or community. Zone information allows the newspaper publisher to target information and advertising to those locations where it would be of the most interest or most effective. Plate color information 210 is included where color is being printed on the page. Although the folio of FIG. 2 is illustrated in standard image form, in general, such folios would be inverted text (white-on-black) images so that they would result in standard text images when printed on the newspaper stock.

Referring again to FIG. 1, plate P is shown in the automatic inspection station (AIS) ready for inspection by the means for optically examining the identifying folios of each of the lithographic plates to ascertain folio information and for optically examining the images of each of the lithographic plates to ascertain image information. In general,the optical examining means may be an image camera 102 which has field of view as indicated by dashes lines 103 for the entire image area of the plate P to generate an electronic image representative of the image on the plate P. This generated electronic image is generally in the form of a series of scans which may be interlaced fields. The image is provided to a frame grabber 104 which selects and stores a single frame, usually made up of two fields of data. This data is provided through CPU 106 to an electronic memory 108 for storage therein. Therefore, frame grabber 104 and CPU 106 constitute means, responsive to the optically examining means in form of image camera 102, for recording in the electronic memory 108 the acertained folio information of the identifying folio of lithographicplate P examined by the image scanner 102.Frame grabber 104 and CPU 106 also constitute means for recording in the electronic 108 the ascertained image information the image I of the lithograph plate P examined by the image camera 102.In general, CPU 106 may be pre-programmed with information identifying the location of the folio and image information or CPU may be provided with software which can locate and distinguish the folio and image information read by the image camera 102. The image and folio information are stored memory 108. CPU 106 is programmed to recognize that the image and folio information from a particular plate correspond to each other and comes from a single frame generated from plate P. As a result, the folio information and the corresponding image,information are cross-referenced by CPU 106.

CPU 106 is connected to a keyboard 110 for use by an operator to access the information in electronic memory 108. In particular, the operator may key in the identifying folio of a particular plate P in order to call up its folio information on a monitor 112 or to create a report generated by a printer 114. In other words, an operator may access information pertaining to an image I of plate P by inputting folio information via keyboard 110. Therefore, keyboard 110, monitor 112, printer 114, and CPU 106 constitute means for accessing the image information of plate P recorded in the electronic memory 108 by reference to the corresponding recorded folio information for plate P whereby the folio information and the image information are cross-referenced.

It may be necessary or desirable to use an optical character reader (OCR) such as an OCR card 116 and its associated software to convert the folio as read by the image camera 102 into digital information which can be stored in the electronic memory 108. This may be accomplished by instructions executed by CPU 106. In particular, CPU 106 would instruct frame grabber 104 to provide the image information or a certain portion of the image information to OCR card 116 via line 118. OCR card 116 would then convert the folio information into digital information which can be stored in memory 108 via CPU 106. Alternatively, a separate scanner 120 may be provided for scanning the folio information and providing the scanned information to OCR card 116 for conversion into digital information.

It is also contemplated that the invention may be provided with means for optically examining the image I of the plate P to ascertain the registration information of the image. The registration information would indicate the position of the image I relative to the edges of the plate P. As a result, the image information would include the ascertained registration information so that the folio information and the ascertained registration information are cross-referenced. In particular, plate P may have lead registration marks LR and trail registration marks TR, the position of which may be compared to the lead edge LE and trail edge TE, respectively, of plate P. If the plate does not have registration marks which will be used for this purpose, the system according to the invention may include a lead edge camera 122 for determining the position of the lead registration mark LR relative to the lead edge bend LEB of the plate P and a trail edge camera 124 for determining the position of the trail registration mark TR relative to the lead edge bend LEB of the plate P. In general, the registration information recorded in memory 108 would include the determined position of the lead and trail registration marks so that the folio information and the determined position information are cross-referenced.

Optionally, the lead edge camera 122 may determine the position of the lead edge of the image I relative to the lead edge bend LEB of the plate P and the trail edge camera 124 may determine the position of the trail edge image I relative to the lead edge bend LEB of the plate P. As a result, the ascertained registration information recorded in memory 108 would include the determined position information of the edges of the plate relative to the lead edge bend LEB so that the folio information and the determined position information are cross-referenced.

In addition, it is contemplated that the system may have means for optically examining the image I of each plate P to ascertain exposure information indicating the exposure of the image I. The image information stored in memory would include the ascertained exposure information so that the folio information and the exposure information are cross-referenced. In particular, the optical examining means may constitute an exposure control camera 126 for measuring one or more lines of the inspected image to ascertain measurement information. In general, the camera 126 would measure the thickness of a particular line of an image to determine its resolution. This measurement information would be part of the image information stored in memory 108 so that accessing the image information via the folio information would allow access to the measurement information. In other words, the measurement information and the folio information would be cross-referenced.

The system may also have means for comparing the image information with preset information stored in a preset information memory 128. As a result, CPU 106 would be able to indicate via monitor 112 or printer 114 any difference between the following: the preset position of the registration marks and the ascertained position of the marks as measured by the cameras 102, 122, 124; and the preset exposure and the exposure as measured by the exposure control camera 126. It is contemplated that the image information stored in memory 106 would include the difference information so that the folio information and the difference information would be cross-referenced.

As illustrated in FIG. 1, the information stored in memory 108 would therefore be of two basic types: folio information and image information. The folio and image information would be cross-referenced so that the image information could be accessible through the folio information and vice versa. Further, the image information may include registration information or exposure information. In the event that registration information is part of the image information, this registration information may be in the form of information identifying the position of the lead edge bend LEB of the plate P with respect to the registration marks or the position of the lead edge bend LEB with respect to the registration image and/or the difference between such position information and preset information stored in memory 128. If exposure information is part of the image information, such exposure information could include an indication of the measurement of one or more lines and/or the difference between the measured lines and preset information stored in memory 128. Table 1 illustrates the information.

TABLE 1

| Type of Information | Example | Range |
|---|---|---|
| Folio | Times 8/13/93 | up to 256 alpha-numeric characters |
| Image Reproduction | graphic ad | text and/or graphics |
| Registration-position WRT Registration mark | 0.25", 0.25" | 0–5", 0–5" |
| Registration-Position WRT Image Edge | 0.4", 0.4" | 0–8", 0–8" |

TABLE 1-continued

| Type of Information | Example | Range |
|---|---|---|
| Exposure-Measurement | 0.001" | 0–0.01" |
| Registration Difference | ±.01" | 0–0.1" |
| Exposure-difference | ±.1" | 0–1" |

It is also contemplated that CPU 106 may interface with a machine programmed logic controller 130 which is controlling the movement of the various plates. An RS232 interface 132 is one preferred embodiment contemplated for interconnecting CPU 106 and machine PLC 130.

FIGS. 3A and 3B are a flow chart of one preferred embodiment of the method according to the invention. At step 302, the plate to be inspected enters the automatic inspection station (AIS) entry conveyor (not shown) from the bender. At step 304, proximity switches determine if the plate is a double page, if one plate is present, or if two plates are present. If the plate is a double page plate, the method proceeds to step 306 where the double page plate is stacked in a stacker. At step 308, the system determines whether another plate is available. If it is not, the system stops at step 310; if another plate is available, the system returns to step 302 to feed the next plate.

Assuming that the plate is a single page plate, the method proceeds to step 312 to determine whether a single plate or left and right plate are present. If two plates are present at step 314, the PLC raises stops to retain the left plate and raises to transfer the right plate to the inspection station at step 316 while the stops restrict the left plate from travelling into the inspection station until inspection of the right plate is complete.

At step 318, proximity or photoelectric sensors detect the presence of the plate in the inspection station. Mandrels extend and a register pin is used to align the lead edge of the plate on the mandrel. Proximity switches indicate when the mandrels are extended.

At step 320 the folio F on the plate P is scanned by the image camera 102 or scanner 120. OCR card and software 116 then identifies the folio information such as the page, date, section, etc. At step 322 the database stored in memory 128 is searched in order to determine the lead and trail attributes. In particular, the database is accessed to determine the zone or area of the plate in which the registration marks will be found.

At step 324 the lead edge LE of the plate P is imaged by the lead edge camera 122 to capture the image of the lead edge of the plate and determine the location of the lead registration mark LR relative to the lead edge bend LEB of the plate. At step 326 the lead registration mark LR on the plate is evaluated by comparing the image of the plate with the predefined image stored in memory 128. The location of the registration mark is then defined as an x, y coordinate value. This is accomplished by frame grabber 104 and CPU 106. In other words, step 326 compares the lead registration mark location to the attributes or tolerances stored in memory 128 to determine if the image is in register.

At step 328 the trail edge TE of the plate P is imaged by the trail edge camera 124 to capture the image of the trail edge of the plate and determine the location of the trail registration mark TR relative to the lead edge bend LEB of the plate. Step 330 corresponds to step 326 for the trail edge. In particular, at step 330, the trail registration mark location is compared to the attributes and tolerances stored in memory 128 to determine if the image is in register.

In both of steps 326 and 330, the CPU 106 compares the values determined by the scanning process to tolerances predefined by the operator and stored in memory 128. The actual data is preferably recorded in a data file named after the date the plate was inspected. If any one of the four values (x, y coordinate values for each registration mark) is out of tolerance, the plate is rejected and an audible signal from the CPU 106 alerts the operator. The monitor 112 displays the data in graph form along with the number of plates that have been out of tolerance and a percentage of accuracy.

At step 332, the line width of the image is scanned by the exposure control camera 126 and compared to tolerances stored in memory 128. Once again, this information is cross-referenced to the folio information. At step 334, all data is written to an ASCII file for reporting functions.

At step 336 the plate exits the automatic inspection station (AIS) and enters the stacking conveyor via rollers. The rollers retract and place the plate on belts that are perpendicular to the rollers. If the plate is in tolerance, it is conveyed to a stacking bin for later use. Alternatively, if the plate is out of tolerance, it is conveyed to a stacking bin for such plates. At step 338, if there is another plate in the entry conveyor, it is transferred to the inspection station and the process begins again with step 302. If another plate is not available, the process ends with step 340.

In view of the above, it will be seen that the several objects of the invention are achieved and other advantageous results attained.

As various changes could be made in the above constructions, products and methods without departing from the scope of the invention, it is intended that all matter contained in the above description and shown in the accompanying drawings shall be interpreted as illustrative and not in a limiting sense.

What is claimed is:

1. An apparatus for inspecting lithographic plates, each plate having an identifying folio including folio information and having an image thereon, the image corresponding to a print image to be printed on sheet material, the apparatus comprising:

means for optically examining the identifying folios of each of the lithographic plates to ascertain the folio information, and for optically examining the images of each of the lithographic plates to ascertain image information;

an electronic memory;

means, responsive to the optically examining means, for recording in the electronic memory the ascertained folio information of the identifying folio of each lithographic plate examined by the optically examining means and for recording in the electronic memory the corresponding ascertained image information of the image of each lithographic plate examined by the optically examining means; and means for cross-referencing the folio information of a particular plate to the corresponding image information of the particular plate, said cross-referencing means including means for accessing the image information of the particular plate recorded in the electronic memory by reference to the corresponding recorded folio information for the particular plate and means for accessing the folio information of the particular plate recorded in the electronic memory by reference to the corresponding recorded image information for the particular plate.

2. The apparatus of claim 1 wherein the optically examining means comprises means for reading the folio including an image scanner or camera and an optical character reader converting the folio as read by the scanner or camera into digital information stored in the electronic memory.

3. The apparatus of claim 1 comprising means for optically examining the image of each plate to ascertain registration information indicating the position of the image relative to the plate and wherein the image information includes the ascertained registration information whereby the folio information and the ascertained registration information are cross-referenced.

4. The apparatus of claim 3 wherein the plate has lead and trail registration marks and further comprising a lead edge camera for determining the position of the lead registration mark relative to the lead edge bend of the plate and a trail edge camera for determining the position of the trail registration mark relative to the lead edge bend of the plate and wherein the registration information recorded in memory includes the determined position information of the registration marks relating to the lead edge bend of the plate whereby the folio information and the determined position information are cross-referenced.

5. The apparatus of claim 4 wherein the lead edge camera determines the position of the lead edge of the image relative to the lead edge bend of the plate and the trail edge camera determines the position of the trail edge of the image relative to the lead edge bend of the plate and wherein the ascertained registration information recorded in memory includes the determined position information of the image edges relative to the lead edge bend of the plate whereby the folio information and the determined position information are cross-referenced.

6. The apparatus of claim 3 further comprising a lead edge camera for determining the position of the lead edge of the image relative to the lead edge bend of the plate and a trail edge camera for determining the position of the trail edge of the image relative to the lead edge bend of the plate and wherein the registration information recorded in memory includes the determined position information of the image edges relative to the lead edge bend of the plate whereby the folio information and the determined position information are cross-referenced.

7. The apparatus of claim 1 comprising means for optically examining the image of each plate to ascertain exposure information indicating the exposure of the image and wherein the image information stored in memory includes the ascertained exposure information whereby the folio information and the exposure information are cross-referenced.

8. The apparatus of claim 7 further comprising an exposure camera for measuring one or more lines of the inspected image to ascertain measurement information and wherein the image information stored in memory includes the measurement information whereby the folio information and the measurement information are cross-referenced.

9. The apparatus of claim 1 further comprising means for comparing the ascertained image information with a preset information and for indicating any difference therebetween as difference information and wherein the image information stored in the memory includes the difference information whereby the folio information and the difference information are cross-referenced.

10. An apparatus for inspecting a lithographic plate having an identifying folio including folio information and having an image thereon, the image corresponding to a print image to be printed on sheet material, the apparatus comprising:

means for optically examining the identifying folio of the lithographic plate to ascertain the folio information;

means for optically examining the image of each plate to ascertain registration information indicating the position of the image relative to the plate;

an electronic memory;

means, responsive to the folio examining means, for recording in the electronic memory the ascertained folio information of the folio of the lithographic plate;

means, responsive to the image examining means, for recording in the electronic memory the ascertained registration information corresponding to the ascertained folio information; and means for cross-referencing the folio information of a particular plate to the corresponding registration information of the particular plate, said cross-referencing means including means for accessing the registration information of the particular plate recorded in the electronic memory by reference to the corresponding recorded folio information for the particular plate and means for accessing the folio information of the particular plate recorded in the electronic memory by reference to the corresponding recorded registration information for the particular plate.

11. The apparatus of claim 10 wherein the plate has lead and trail registration marks and further comprising a lead edge camera for determining the position of the lead registration mark relative to the lead edge bend of the plate and a trail edge camera for determining the position of the trail registration mark relative to the lead edge bend of the plate and wherein the registration information recorded in memory includes the determined position information of the registration marks relative to the lead edge bend of the plate whereby the folio information and the determined position information relative to the registration marks are cross-referenced.

12. The apparatus of claim 11 wherein the lead edge camera determines the position of the lead edge of the image relative to the lead edge bend of the plate and the trail edge camera determines the position of the trail edge of the image relative to the lead edge bend of the plate and wherein the ascertained registration information recorded in memory includes the determined position information of the image relative to the lead edge bend of the plate whereby the folio information and the determined position information are cross-referenced.

13. The apparatus of claim 10 further comprising a lead edge camera for determining the position of the lead edge of the image relative to the lead edge bend of the plate and a trail edge camera for determining the position of the trail edge of the image relative to the lead edge bend of the plate and wherein the registration information recorded in memory includes the determined position information of the image edges relative to the lead edge bend of the plate whereby the folio information and the determined position information are cross-referenced.

14. The apparatus of claim 10 comprising means for optically examining the image of each plate to ascertain exposure information indicating the exposure of the image and wherein the information stored in memory includes the ascertained exposure information whereby the folio information and the exposure information are cross-referenced.

15. The apparatus of claim 14 further comprising an exposure camera for measuring one or more lines of the inspected image to ascertain measurement information and wherein the information stored in memory includes the measurement information whereby the folio information and the measurement information are cross-referenced.

16. The apparatus of claim 10 further comprising means for comparing the ascertained registration information with a preset information and for indicating any difference therebetween as difference information and wherein the information stored in the memory includes the difference information whereby the folio information and the difference information are cross-referenced.

17. An apparatus for inspecting a lithographic plate having an identifying folio including folio information and having an image thereon, the image corresponding to a print image to be printed on sheet material, the apparatus comprising:

means for optically examining the identifying folio of the lithographic plate to ascertain the folio information;

means for optically examining the image of each plate to ascertain exposure information indicating the exposure of the image;

an electronic memory;

means, responsive to the folio examining means, for recording in the electronic memory the ascertained folio information of the folio of the lithographic plate; and means, responsive to the image examining means, for recording in the electronic memory the ascertained exposure information corresponding to the ascertained folio information; and means for cross-referencing the folio information of a particular plate to the corresponding exposure information of the particular plate, said cross-referencing means including means for accessing the exposure information of the particular plate recorded in the electronic memory by reference to the corresponding recorded folio information for the particular plate and means for accessing the folio information of the particular plate recorded in the electronic memory by reference to the corresponding recorded exposure information for the particular plate.

18. The apparatus of claim 17 further comprising an exposure camera for measuring one or more lines of the inspected image to ascertain measurement information and wherein the information stored in memory includes the measurement information whereby the folio information and the measurement information are cross-referenced.

19. The apparatus of claim 17 further comprising means for comparing the ascertained exposure information with a preset information and for indicating any difference therebetween as difference information and wherein the information stored in the memory includes the difference information whereby the folio information and the difference information are cross-referenced.

20. The apparatus of claim 17 comprising means for optically examining the image of each plate to ascertain registration information indicating the position of the image relative to the plate and wherein the image information includes the ascertained registration information whereby the folio information and the ascertained registration information are cross-referenced.

21. The apparatus of claim 17 wherein the plate has lead and trail registration marks and further comprising a lead edge camera for determining the position of the lead registration mark relative to the lead edge bend of the plate and a trail edge camera for determining the position of the trail registration mark relative to the lead edge bend of the plate and wherein the registration information recorded in memory includes the determined position information of the registration marks relative to the lead edge bend of the plate whereby the folio information, the exposure information and the determined position information are cross-referenced.

22. The apparatus of claim 17 further comprising a lead edge camera for determining the position of the lead edge of the image relative to the lead edge bend of the plate and a trail edge camera for determining the position of the trail edge of the image relative to the lead edge bend of the plate and wherein the registration information recorded in memory includes the determined position information of the image edges relative to the lead edge bend of the plate whereby the folio information, the exposure information and the determined position information are cross-referenced.

23. A method for inspecting lithographic plates, each plate, having an identifying folio including folio information and having an image thereon, the image corresponding to a print image to be printed on sheet material, the method comprising the steps of:

optically examining the identifying folios of each of the lithographic plates to ascertain the folio information;

optically examining the images each of the lithographic plates to ascertain images of information;

recording in an electronic memory the ascertained folio information of the identifying folio of each of lithographic plate optically examined;

recording in the electronic memory the corresponding ascertained image information of the image of each lithographic plate optically examined; and cross-referencing the folio information of a particular plate to the corresponding image information of the particular plate, said cross-referencing step including accessing the image information of the particular plate recorded in the electronic memory by reference to the corresponding recorded folio information for the particular plate and accessing the folio information of the particular plate recorded in the electronic memory by reference to the corresponding recorded image information for the particular plate.

24. The method of claim 23 wherein the optically examining step comprises the step of reading the folio by an image scanner or camera and an optical character reader converting the folio as read by the scanner or camera into digital information stored in the electronic memory.

25. The method of claim 23 comprising the step of optically examining the image of each plate to ascertain registration information indicating the position of the image relative to the plate and wherein the image information includes the ascertained registration information whereby the folio information and the ascertained registration information are cross-referenced.

26. The method of claim 23 further comprising the steps of comparing the ascertained image information with a preset information, indicating any difference therebetween as difference information and storing the difference information corresponding to the ascertained image information in the memory whereby the folio information and the difference information are cross-referenced.

27. A method for inspecting a lithographic plate having an identifying folio including folio information and having an image thereon, the image corresponding to a print image to be printed on sheet material, the method comprising the steps of:

optically examining the identifying folio of the lithographic plate to ascertain the folio information;

optically examining the image of each plate to ascertain registration information indicating the position of the image relative to the plate;

recording in an electronic memory the ascertained folio information of the folio of the lithographic plate;

recording in the electronic memory the ascertained registration information corresponding to the ascertained folio information; and cross-referencing the folio information of a particular plate to the corresponding registration information of the particular plate, said cross-referencing step including accessing the registration information of the particular plate recorded in the electronic memory by reference to the corresponding recorded folio information for the particular plate and accessing the folio information of the particular plate recorded in the electronic memory by reference to the corresponding recorded registration information for the particular plate.

28. The method of claim 27 further comprising the steps of comparing the ascertained registration information with a preset information, indicating any difference therebetween as difference information and storing the difference information corresponding to the ascertained registration information in the memory whereby the folio information and the difference information are cross-referenced.

29. A method for inspecting a lithographic plate having an identifying folio including folio information and having an image thereon, the image corresponding to a print image to be printed on sheet material, the method comprising the steps of:

optically examining the identifying folio of the lithographic plate to ascertain the folio information;

optically examining the image of each plate to ascertain exposure information indicating the exposure of the image;

recording in an electronic memory the ascertained folio information of the folio of the lithographic plate; and recording in the electronic memory the ascertained exposure information corresponding to the ascertained folio information; and cross-referencing the folio information of a particular plate to the corresponding exposure information of the particular plate, said cross-referencing step including accessing the exposure information of the particular plate recorded in the electronic memory by reference to the corresponding recorded folio information for the particular plate and accessing the folio information of the particular plate recorded in the electronic memory by reference to the corresponding recorded exposure information for the particular plate.

30. The method of claim 29 comprising the step of optically examining the image of each plate to ascertain registration information indicating the position of the image relative to the plate and wherein the image information includes the ascertained registration information whereby the folio information and the ascertained registration information are cross-referenced.

31. The method of claim 29 further comprising the steps of comparing the ascertained exposure information with a preset information, indicating any difference therebetween as difference information, and storing the difference information corresponding to the ascertained exposure information in the memory whereby the folio information and the difference information are cross-referenced.

* * * * *